(12) United States Patent
Takahashi

(10) Patent No.: US 8,166,914 B2
(45) Date of Patent: May 1, 2012

(54) PLASMA PROCESSING APPARATUS OF BATCH TYPE

(75) Inventor: Toshiki Takahashi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 945 days.

(21) Appl. No.: 12/219,218

(22) Filed: Jul. 17, 2008

(65) Prior Publication Data
US 2009/0032190 A1 Feb. 5, 2009

(30) Foreign Application Priority Data

Jul. 31, 2007 (JP) ................................. 2007-200114

(51) Int. Cl.
*B05B 5/025* (2006.01)
*B05C 5/00* (2006.01)
*B05C 9/08* (2006.01)
*C23C 16/00* (2006.01)
*C23F 1/00* (2006.01)
*H01L 21/306* (2006.01)

(52) U.S. Cl. .................... 118/723 E; 118/620; 118/715; 118/729; 156/345.33; 156/345.47; 156/345.48; 156/345.51

(58) Field of Classification Search .................... None
See application file for complete search history.

(56) References Cited

U.S. PATENT DOCUMENTS

| | | | | |
|---|---|---|---|---|
| 6,727,654 | B2 * | 4/2004 | Ogawa et al. ............ | 315/111.01 |
| 2001/0010307 | A1 * | 8/2001 | Saito et al. ..................... | 219/390 |
| 2003/0164143 | A1 * | 9/2003 | Toyoda et al. ............ | 118/723 E |
| 2004/0219793 | A1 * | 11/2004 | Hishiya et al. ................ | 438/706 |
| 2005/0106869 | A1 * | 5/2005 | Ooyabu et al. ................ | 438/689 |
| 2005/0211264 | A1 * | 9/2005 | Kostenko et al. .............. | 134/1.1 |
| 2006/0205231 | A1 | 9/2006 | Chou et al. | |
| 2006/0216950 | A1 * | 9/2006 | Matsuura ...................... | 438/775 |
| 2007/0079753 | A1 | 4/2007 | Padhi et al. | |

FOREIGN PATENT DOCUMENTS

| | | |
|---|---|---|
| CN | 1502120 A | 6/2004 |
| CN | 1643663 A | 7/2005 |
| CN | 1837404 A | 9/2006 |
| JP | 2-159027 | 6/1990 |
| JP | 3-224222 | 10/1991 |
| JP | 6-77138 | 3/1994 |
| JP | 2002-299329 | 10/2002 |
| JP | 2004-285469 | 10/2004 |
| JP | 2005-64017 | 3/2005 |

OTHER PUBLICATIONS

Chinese Office Action mailed Oct. 29, 2010 for Chinese Patent Application No. 200810128089.4 w/ English language translation.

* cited by examiner

*Primary Examiner* — Dah-Wei Yuan
*Assistant Examiner* — Binu Thomas
(74) *Attorney, Agent, or Firm* — Smith, Gambrell & Russell, LLP

(57) ABSTRACT

A plasma processing apparatus of the batch type includes a tubular process container having a closed end and an open end opposite to each other, and a process field for accommodating target substrates, the process container including a tubular insulating body. The apparatus further includes a holder configured to hold the target substrates at intervals, a loading mechanism configured to load and unload the holder into and from the process container, and a lid member connected to the loading mechanism and configured to airtightly close the open end. A first electrode is disposed at the closed end of the process container, and a second electrode is disposed at the lid member, to constitute a pair of parallel-plate electrodes. An RF power supply is connected to one of the first and second electrodes and configured to apply an RF power for plasma generation.

20 Claims, 7 Drawing Sheets

PLASMA PROCESSING APPARATUS OF BATCH TYPE

BACKGROUND OF THE INVENTION

1. Field of the Invention

The present invention relates to a plasma processing apparatus of the batch type for performing a plasma process, such as a film formation process or etching process using plasma, on target substrates, such as semiconductor wafers, and particularly to a technique utilized in the semiconductor process field. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing integrated circuits, a semiconductor wafer, such as a silicon wafer is subjected to various processes, such as film formation, etching, oxidation, diffusion, reformation, and natural oxide film removal. As apparatuses for performing the processes described above on semiconductor wafers, there is known a processing apparatus of the single-substrate type configured to process semiconductor wafers one by one, and a processing apparatus of the batch type configured to process a plurality of semiconductor wafers all together.

In recent years, owing to the demands of increased miniaturization and integration of semiconductor integrated circuits, it is required to process wafers at a lower temperature. This is intended to prevent the profile of doping impurities from changing, to prevent inter-level insulating films, such as low dielectric constant insulating films, from degrading their film quality, and/or to accept the limit of the heat-resistance temperature of underlying laminated films. In order to reply to such a demand, plasma processing apparatuses are often used to perform various processes, such as those described above, at a lower temperature while utilizing plasma assistance.

Jpn. Pat. Appln. KOKAI Publication No. 2004-285469 (Patent Document 1) and Jpn. Pat. Appln. KOKAI Publication No. 2005-64017 (Patent Document 2) disclose examples of the plasma processing apparatuses of the single-substrate type. According to the processing apparatuses disclosed in these documents, for example, an RF (radio frequency) power is applied across parallel-plate electrodes to generate plasma. This plasma is used to activate a process gas, so that a predetermined process, such as film formation or etching, can be performed at a relatively low temperature.

Jpn. Pat. Appln. KOKAI Publication No. 2-159027 (Patent Document 3) and Jpn. Pat. Appln. KOKAI Publication No. 3-224222 (Patent Document 4) disclose examples of the plasma processing apparatuses of the batch type. According to the processing apparatuses disclosed in these documents, a vertical process container configured to array wafers at regular intervals is used. The process container is surrounded by a plurality of electrodes arrayed in an annular direction, to which an RF power is applied to generate plasma.

US 2006/0205231 A1 (Patent Document 5) discloses a plasma processing apparatus including a vertical process container made of quartz and a plasma generation mechanism disposed on one side of the process container along its longitudinal direction. A process gas is activated by plasma generated by the plasma generation mechanism and is horizontally supplied into the process container, so that a predetermined plasma process, such as film formation, is performed on the surface of semiconductor wafers.

BRIEF SUMMARY OF THE INVENTION

An object of the present invention is to provide a plasma processing apparatus of the batch type that can improve the throughput and the yield of products.

According to one aspect of the present invention, there is provided a plasma processing apparatus of the batch type for performing a plasma process on a plurality of target substrates all together, the apparatus comprising: a tubular process container having a closed end and an open end opposite to each other, and a process field for accommodating the target substrates between the closed end and the open end, the process container comprising a tubular insulating body; a holder configured to hold the target substrates in parallel with each other and at intervals, and to be loaded and unloaded through the open end into and from the process container; a loading mechanism configured to load and unload the holder into and from the process container; a lid member connected to the loading mechanism and configured to airtightly close the open end; a gas supply system configured to supply a process gas into the process container; an exhaust system configured to exhaust gas from inside the process container; a first electrode disposed at the closed end of the process container; a second electrode disposed at the lid member, the first and second electrodes constituting a pair of parallel-plate electrodes insulated from each other by the insulating body of the process container; and an RF (radio frequency) power supply connected to one of the first and second electrodes and configured to apply an RF power for plasma generation.

The apparatus described above may be arranged such that the insulating body has a length larger than the process field, and the insulating body of the process container is surrounded by a heater for heating the target substrates. The process container may comprise a tubular metal manifold connected to the insulating body and forming the open end. Typically, the closed end and the open end are an upper end and a lower end of the process container, respectively, and the holder is configured to hold the target substrates at intervals in a vertical direction. The insulating body of the process container may have a double-tube structure comprising an inner tube and an outer tube with a gap space interposed therebetween. Alternatively, the insulating body of the process container may have a single-tube structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
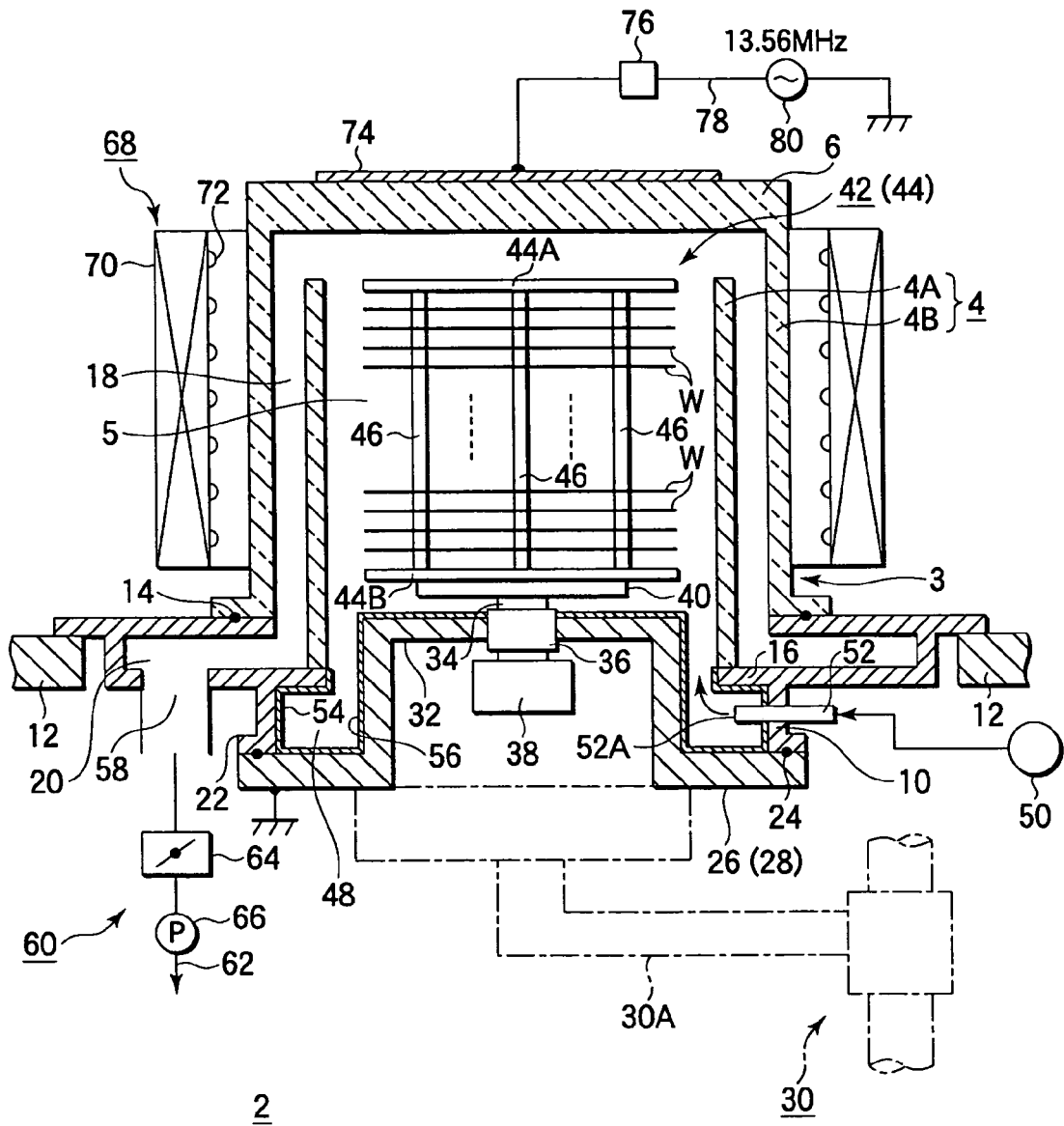
FIG. 1 is a sectional view showing a plasma processing apparatus of the batch type (vertical plasma processing apparatus) according to an embodiment of the present invention.

In the process of developing the present invention, the inventors studied problems with regard to the conventional plasma processing apparatuses. As a result, the inventors have arrived at the findings given below.

In the case of plasma processing apparatuses of the single-substrate type, as disclosed in Patent Documents 1 and 2, semiconductor wafers are processed one by one, and so the processing rate for each wafer can be very high. However, in the plasma processing apparatuses of the single-substrate type, the processing rate for a certain number of wafers is relatively lower, and so the throughput of the process is lower, as compared to plasma processing apparatuses of the batch type, although it depends on the size of the process container.

In the case of plasma processing apparatuses of the batch type, as disclosed in Patent Documents 3 and 4, a plurality of electrodes disposed around the process container complicate the structure of the apparatus. Further, as regards the plasma distribution, the electric filed density differs between the center and ends of the electrodes, and makes it difficult to attain a uniform plasma density in the process container.

In the case of plasma processing apparatuses of the batch type, as disclosed in Patent Document 5, a process gas activated by plasma is supplied from one side of the process container in parallel with the wafer surface, as described above. In this case, the plasma density distribution can be easily less uniform on the wafer surface, and thereby bring about charge-up damage on the wafer surface and decrease the yield of products.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
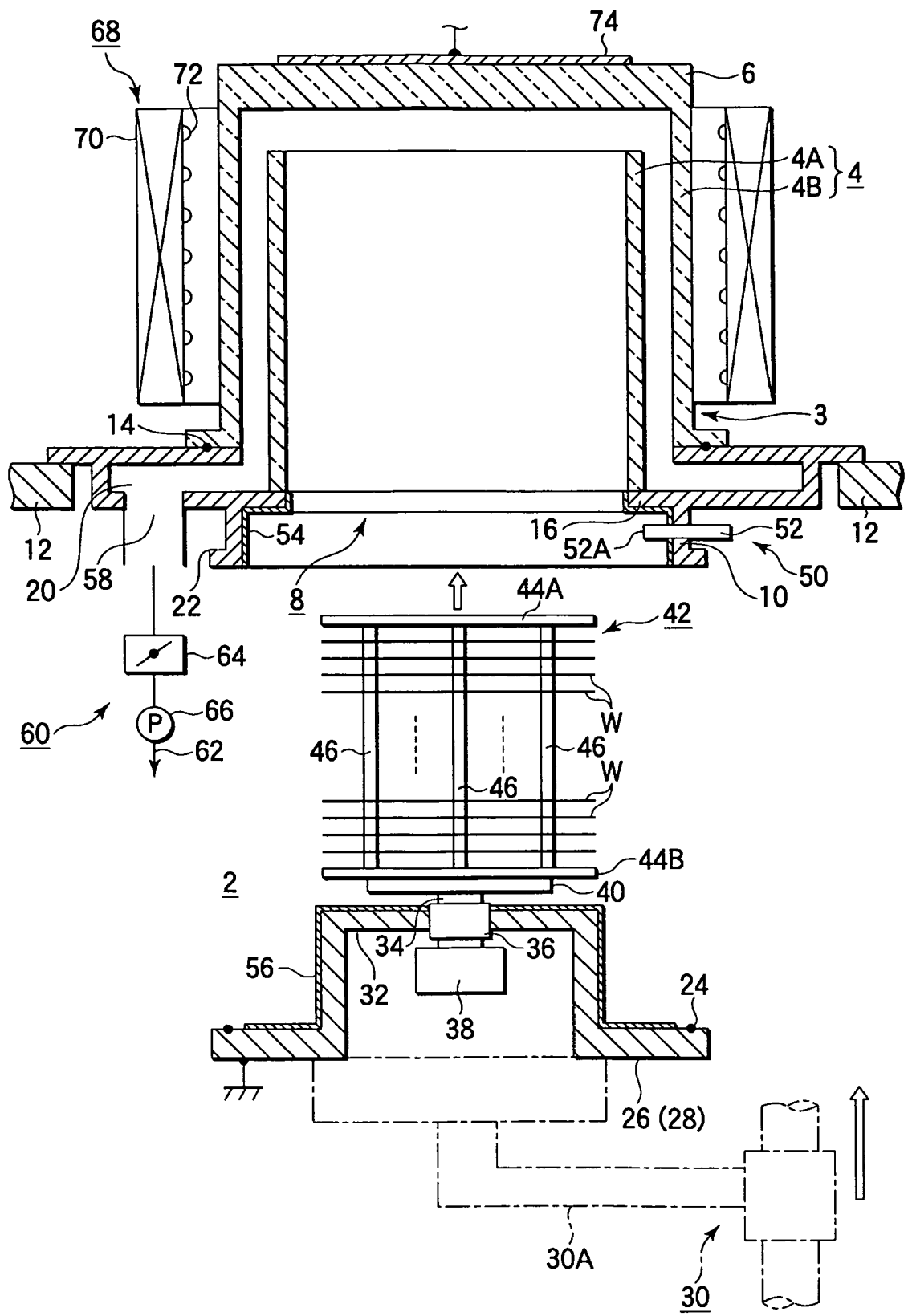
FIG. 2 is a view showing the plasma processing apparatus of FIG. 1 in a state where the wafer boat is present outside the process container.

FIG. 1 is a sectional view showing a plasma processing apparatus of the batch type (vertical plasma processing apparatus) according to an embodiment of the present invention. FIG. 2 is a view showing the plasma processing apparatus of FIG. 1 in a state where the wafer boat is present outside the process container.

As shown in FIGS. 1 and 2, this plasma processing apparatus 2 includes a process container 3 having a cylindrical container body 4 (insulating body) made of a dielectric material, such as quartz. The container body 4 has a double-tube structure, which is formed of a cylindrical inner tube 4A stood in the vertical direction and a cylindrical outer tube 4B concentrically disposed around the inner tube 4A. The inner tube 4A is opened at both of the upper and lower ends, while the outer tube 4B is opened at the lower end and is closed at the upper end as a ceiling portion 6. The inner tube 4A forms a process field 5 therein for processing semiconductor wafers W, which is connected to an opening 8 (see FIG. 2) formed at the lower end of the container body 4. The ceiling portion 6 is flat with a planar upper surface. The ceiling portion 6 has a thickness of about 20 mm to ensure a sufficient pressure resistance.

The entirety of the container body 4 is supported by a cylindrical metal manifold 10 that forms a lower part of the process container 3. Specifically, the manifold 10 is made of a metal, such as stainless steel, and is supported by a base plate 12 at the peripheral portion. The lower end of the outer tube 4B is airtightly supported on the upper side of the base plate 12 through a seal member 14, such as an O-ring.

The manifold 10 has an annular support portion 16 extending inward from the sidewall at the midpoint in the vertical direction. The lower end of the inner tube 4A is placed on the support portion 16, so that the inner tube 4A is supported. The manifold 10 has an annular exhaust space 20 formed therein and extending in an annular direction to communicate with the gap space 18 between the inner tube 4A and outer tube 4B. The annular exhaust space 20 is configured to uniformly exhaust the atmosphere inside the container body 4 without localization.

The manifold 10 has an opening at the lower end, which is formed as the transfer port of the process container 3, and an annular flange 22 extending outward around the opening. The transfer port of the process container 3 at the lower end, i.e., the opening of the manifold 10 at the lower end, is airtightly closed by a detachable lid member 26 through a seal member 24, such as an O-ring. The lid member 26 is shaped as a whole from an electrically conductive plate made of a metal, such as stainless steel, so that it also serves as a lower electrode 28, which is grounded.

The lid member 26 is supported by the distal end of an arm 30A of a loading mechanism 30. The loading mechanism 30 is formed of an elevating mechanism, such as a boat elevator. The lid member 26 is moved up and down by the loading mechanism 30, as shown in FIG. 2.

The central portion of the lid member 26 projects inward in the container body 4 toward the center, i.e., projects upward in this embodiment, to form a mount portion 32 having a flat upper surface. A rotary shaft 34 extends through the center of the mount portion 32 of the lid member 26. The part of the mount portion 32 where the rotary shaft 34 penetrates is provided with, e.g., a magnetic-fluid seal 36, so that the rotary shaft 34 is rotatably supported while the interior of the process container 3 is kept airtight. The lower end of the rotary shaft 34 is connected to a rotary motor 38 for rotating it, while the upper end of the rotary shaft 34 is connected to a boat table 40.

On the boat table 40, a holder 42 for holding a plurality of target substrates or semiconductor wafers W is supported. The holder 42 is formed of a wafer boat 44 comprising a top plate 44A and a bottom plate 44B respectively on the upper and lower sides and a plurality of, such as three, struts extending therebetween, wherein all the members of the wafer boat 44 are made of, e.g., quartz. The struts 46 has wafer support grooves (not shown) formed thereon at predetermined intervals, such as 1 cm. The peripheral portions of the wafers W are inserted in the wafer support grooves, so that the wafers W are supported in parallel with each other and at predetermined intervals in the vertical direction.

The number of wafers W is not limited to a specific one, but it may be 25 to 30, for example. The wafer boat 44 with the semiconductor wafers W supported thereon is moved up and down by the loading mechanism 30, so that the wafer boat 44 is loaded and unloaded into and from the process container 3 from and to a loading area (not shown) therebelow. When the opening of the manifold 10 at the lower end is closed by the lid member 26, an annular gas diffusion space 48 is formed at a portion surrounded by the lid member 26, the inner wall of the manifold 10, and the support portion 16.

The manifold 10 is connected to a gas supply section 50 for supplying gases into the process container 3. Specifically, the gas supply section 50 is connected to a gas supply nozzle 52 made of, e.g., quartz and penetrating the sidewall of the manifold 10. The gas supply nozzle 52 has a gas spouting port 52A opened to the annular gas diffusion space 48. The gas supply section 50 is configured to supply a predetermined process gas at a controlled flow rate through the gas supply nozzle 52 into the gas diffusion space 48, in which the gas is diffused. FIGS. 1 and 2 show only one gas supply nozzle 52 as an example, but actually a plurality of nozzles are disposed in accordance with the type of gases to be supplied.

For protection from plasma, the inner surface of the manifold 10 and the inner surface of the lid member 26, which are present inside the process container 3, are covered with insulating layers 54 and 56. The insulating layers 54 and 56 may be formed of, e.g., a thin quartz plate or insulative thin film bonded thereto. The manifold 10 has an exhaust port 58 formed in a wall defining the exhaust space 20. The exhaust port 58 is connected to an exhaust section 60, which includes a pressure regulation valve 64, a vacuum pump 66, and so forth sequentially provided on an exhaust line 62 connected to the exhaust port 58. The exhaust section 60 can vacuum-exhaust gas from inside the process container 3 and keep the interior of the process container 3 at a predetermined pressure.

The outer tube 4B of the container body 4 is surrounded by a heating mechanism 68 for heating the semiconductor wafers W. The heating mechanism 68 includes a cylindrical heat-insulating body 70, and a heater 72 disposed inside the heat-insulating body 70 to surround the entirety of the process field 5, in which the wafers W are placed. However, the heating mechanism 68 may be omitted if the wafers W can be heated to a predetermined temperature by use only of the heat of plasma.

Further, an upper electrode 74 is disposed on the upper surface of the flat ceiling portion 6 of the container body 4. The upper electrode 74 is formed of a circular thin plate made of a metal, such as an aluminum alloy or stainless steel. The electrode 74 has a diameter slightly larger than that of the wafers W. The upper electrode 74 is connected to an RF (radio frequency) power supply 80 for plasma generation through a line 78 provided with a matching circuit 76 for impedance matching. The RF power supply 80 is configured to apply an RF power to the upper electrode 74.

This RF power has a frequency of, e.g., 13.56 MHz, but it may have another frequency of, e.g., 40 kHz or 400 kHz. The distance between the upper surface of the mount portion 32 of the lower electrode 28, which also serves as the lid member 26, and the upper electrode 74 is not limited to a specific value, as long as it allows plasma generation within the process field 5. However, this distance may be preferably set at a value within a range of 40 to 50 cm. As regards the size of the semiconductor wafers W used here, the diameter of the wafers W may be 300 mm (12 inches) or 200 mm (8 inches), while the diameter of the container body 4 is preset in accordance with the diameter of the wafers W. In order to ensure the safety, the entirety of the process container 3 is covered with an RF (electromagnetic) shield (not shown) for cutting off RF.

Next, an explanation will be given of an operation of the plasma processing apparatus 2 having the structure described above.

At first, as shown in FIG. 2, the loading mechanism 30 is set at a lower position in the loading area. The holder 42 or wafer boat 44 and the lid member 26 are moved in unison in loading and unloading into and from the process container 3.

In the loading area, unprocessed semiconductor wafers W are transferred onto the wafer boat 44 and are supported thereon at intervals in the vertical direction. Then, the arm 30A is moved up by the loading mechanism 30, so that the lid member 26 is moved up along with the wafer boat 44 with the wafers W supported thereon. Consequently, the wafer boat 44 is loaded through the bottom transfer port of the manifold 10 into the process field 5 heated to a predetermined temperature in advance. When the loading of the wafer boat 44 is finished, the transfer port of the manifold 10 is airtightly closed by the lid member 26.

The interior of the process container 3 is continuously vacuum-exhausted by the vacuum pump 66 of the exhaust section 60. After the loading of the wafer boat 44, the wafer W is maintained at a predetermined process temperature by the heater 72 of the heating mechanism 68. Further, a necessary process gas is supplied at a controlled flow rate from the gas supply section 50 through the gas supply nozzle 52 into the process field 5, while the wafer boat 44 is rotated by the rotary motor 38.

At the same time, an RF power is applied from the RE power supply 80 across the upper electrode 74 disposed on top of the ceiling portion 6 and the lower electrode 28 that also serves as the lid member 26. Consequently, plasma of the process gas is generated within the process field 5.

The upper electrode 74 and lower electrode 28 are insulated from each other by the container body 4 (insulating body), so that they serve as a pair of parallel-plate electrodes coupled with each other by capacitive coupling. With this arrangement, plasma is generated all over the process field 5 to process the wafers W by a predetermined plasma process, such as a plasma film formation process, plasma etching process, or plasma ashing process. In this case, since plasma is essentially uniformly generated within the process field 5, the wafers W are prevented from suffering charge-up damage, thereby improving the yield of products as well as the throughput. Particularly, the mount portion 32 is formed on the lid member 26 to shorten the distance between the lower electrode 28 and upper electrode 74, as far as possible. In this case, plasma can be easily generated, and so the plasma generation within the process field 5 becomes efficient.

When the process gas is supplied from the gas supply nozzle 52, it is diffused in an annular direction inside the annular gas diffusion space 48 defined by the manifold 10 and the peripheral portion of the lid member 26. Then, the process gas flows upward within the process field 5 inside the inner tube 4A of the container body 4 and comes into contact with the wafers W being rotated. Then, the process gas turns around at the ceiling portion 6 of the container body 4 and flows downward. Then, the process gas flows downward through the gap space 18 between the inner tube 4A and outer tube 4B, and is exhausted from an exhaust port 58 formed in the manifold 10 to the exhaust section 60. The gap space 18 between the inner tube 4A and outer tube 4B is connected at the lower end to the annular exhaust space 20, which projects outward in the radial direction relative to the outer tube 4B and thus is relatively large. The annular exhaust space 20 cooperates with the gas diffusion space 48 to form uniform flows of the atmosphere inside the process field 5, in which the wafers W are placed.

The inner surfaces of the manifold 10 and lid member 26 are covered with the protection insulating layers 54 and 56. Hence, the manifold 10 and lid member 26 both made of a metal are prevented from being damaged by plasma and/or prevented from causing abnormal electric discharge.

The process temperature of the wafers W used in this plasma process can be set lower due to the plasma assistance effect. For example, the process temperature of a plasma film formation process may be decreased to a very low temperature, such as room temperature, i.e., about 25° C., although it depends on the type of the process.

As described above, according to this embodiment of the present invention, two electrodes, such as the lower electrode 28 and upper electrode 74, are disposed on the opposite sides of the tubular process container 3. An RF power is applied to one of the electrodes, such as the upper electrode 74, so that plasma is generated and used to process a plurality of target substrates. Accordingly, there is provided an apparatus that can render advantages corresponding to not only an apparatus of the batch type but also an apparatus of the single-substrate type, so as to improve the yield of products as well as the throughput.

<Examination of Plasma Generation>

An experiment was conducted to confirm plasma generation in the plasma processing apparatus 2 having the structure described above. As a result, it was confirmed that plasma was generated all over the process field 5. In this experiment, the size of the respective components and the process conditions were set as follows.

Diameter of inner tube 4A: 330 to 350 mm,
Diameter of outer tube 4B: 400 to 450 mm,
Distance between electrodes 28 and 74: 800 to 1,000 mm,
Gas type: $N_2$,
Pressure: 0.5 Torr (66.7 Pa), and
RF power: 100 watts.

<Examination of Film Formation>

Figure 3:
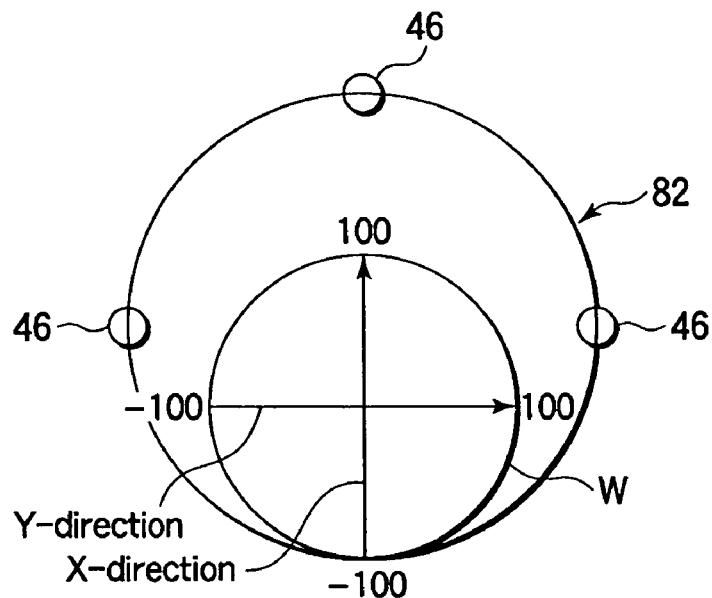
FIG. 3 is a view for explaining the position of a test wafer on a support plate used for examination of film formation.

A plasma film formation process was performed in the plasma processing apparatus described above to perform examination of film formation. In this experiment, $NH_3$, $SiH_4$, and $N_2$ were used as process gases to form a silicon nitride film. FIG. 3 is a view for explaining the position of a test wafer on a support plate used for this examination of film formation.

In this experiment, support plates 82 having a diameter of 300 mm were supported on the struts 46 of the wafer boat 44 designed to support wafers having a diameter of 300 mm. Further, test wafers W having a diameter of 200 mm were respectively placed on the support plates 82 at a position shifted to one side, as shown in FIG. 3. Then, the film formation process was performed and the film thickness was measured at positions on each test wafer in an X-direction and a Y-direction perpendicular thereto.

In this experiment, the process conditions were set as follows.

Process temperature: 25° C.,
Process pressure: 0.01 Torr (full throttle to vacuum pump),
Gas flow rate: $NH_3/SiH_4/N_2$=20/25/50 sccm,
RF power: 200 watts, and
Film formation time: 15 minutes.

Figure 4:
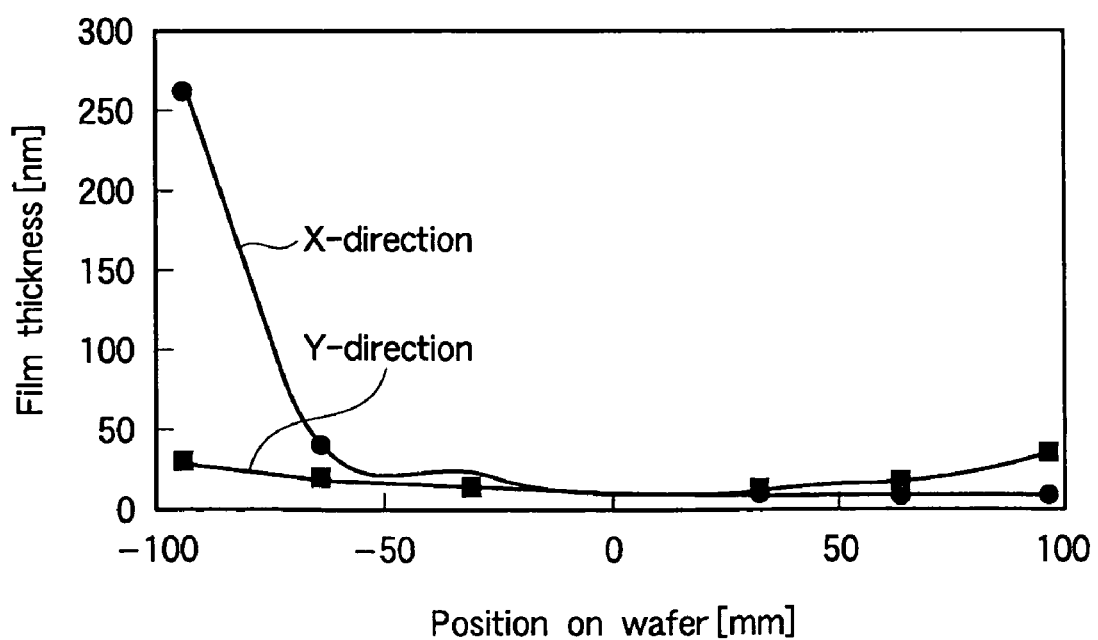
FIG. 4 is a graph showing the film thickness distribution on the wafer surface.

FIG. 4 is a graph showing the film thickness distribution on the wafer surface, obtained by this experiment. As shown in FIG. 4, the thin film had a large thickness of about 260 nm at a position near −100 mm in the X-direction, i.e., the peripheral portion of each support plate 82. Otherwise, the thickness of the thin film was almost constant in both of the X-direction and Y-direction.

As results of measurement of the film thickness, the film formation rate in the X-direction was 1.68 nm/min (planar uniformity: ±252.3%), and the film formation rate in the Y-direction was 0.56 nm/min (planar uniformity: ±66.8%). From these results, it was confirmed that the thin film (silicon nitride film) had a sufficient thickness, although the planar uniformity of film thickness was insufficient.

<Examination of Pressure Dependency of Film Formation>

An experiment was conducted to confirm the pressure dependency of film formation (silicon nitride film) in the plasma processing apparatus described above. In this experiment, the set position of the wafers and the measurement positions on the wafers were set to be the same as those used in the experiment explained with reference to FIG. 3.

In this experiment, the process conditions were set as follows.

Process temperature: 25° C.,
Process pressure: 0.01 Torr (full throttle), 0.05 Torr, 0.1 Torr, and 0.50 Torr,
Gas flow rate: $NH_3/SiH_4/N_2$=20/25/50 sccm,
RF power: 200 watts, and
Film formation time: 15 minutes.

Figure 5A:
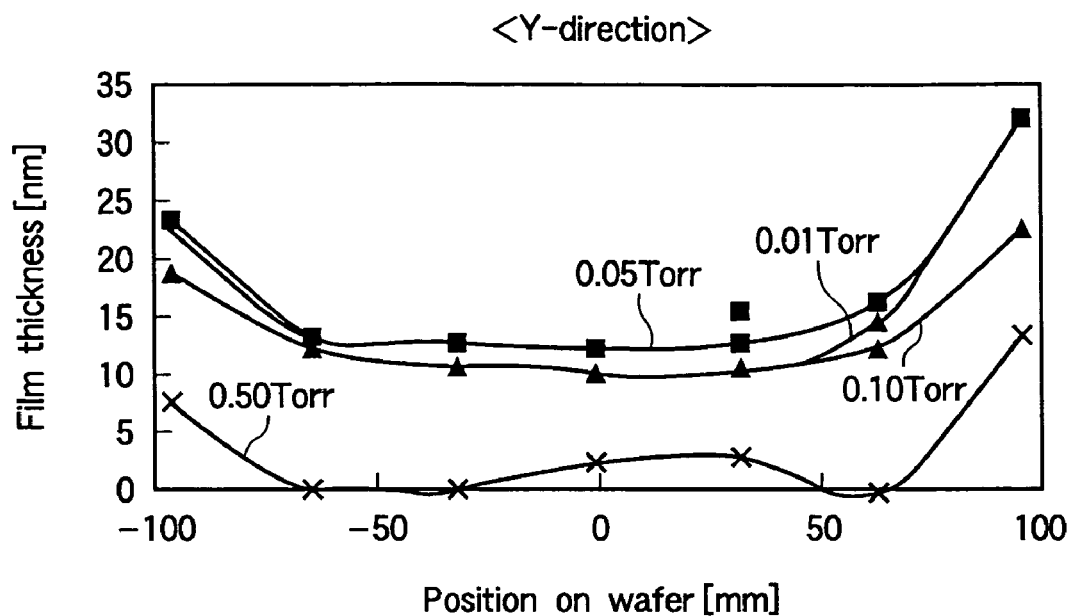
FIGS. 5A and 5B are graphs showing the film thickness distribution on the wafer surface in a Y-direction and X-direction, respectively.
Figure 5B:
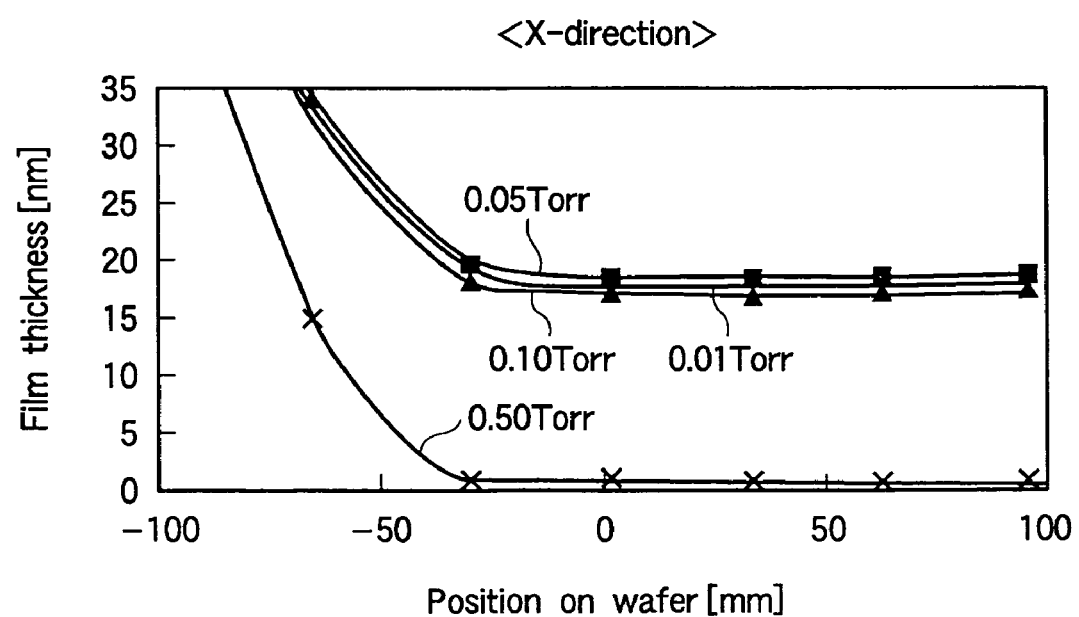

FIG. 5A shows the film thickness distribution on the wafer surface in the Y-direction, and FIG. 5B shows the film thickness distribution on the wafer surface in the X-direction. As shown in FIG. 5A, where the pressure was set at 0.5 Torr, the film formation state was undesirable such that the film was not formed on the wafer surface at several positions. On the other hand, where the pressure was set at 0.01 to 0.10 Torr, it was confirmed that the thin film had a sufficient thickness, although the planar uniformity of film thickness was insufficient.

Similarly, as shown in FIG. 5B, where the pressure was set at 0.5 Torr, the film was hardly formed on the wafer surface. On the other hand, where the pressure was set at 0.01 to 0.10 Torr, it was confirmed that the thin film had a sufficient thickness except for some parts of the edge of each wafer.

Figure 6:
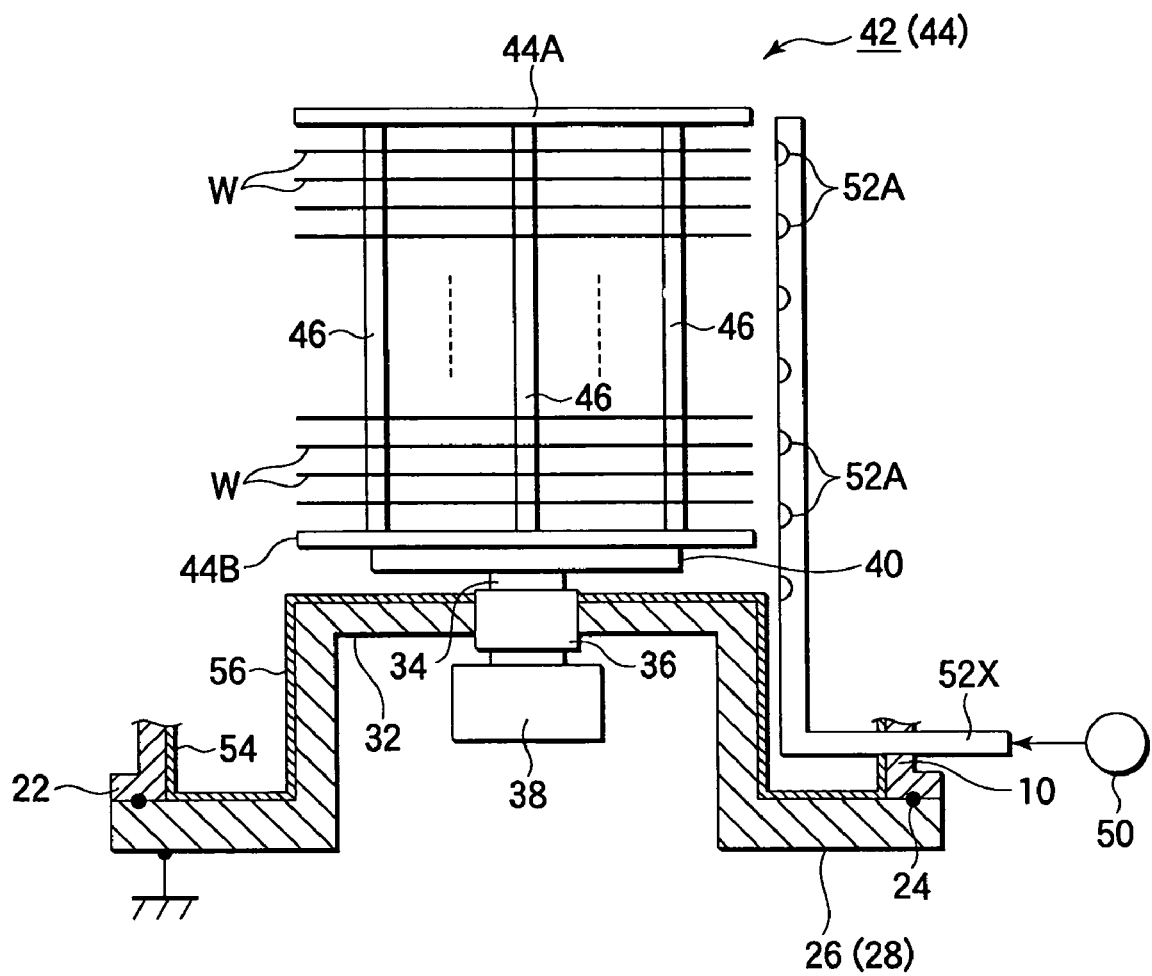
FIG. 6 is a view showing a part of a structure that employs a gas supply nozzle of the distribution type (gas distribution nozzle)

In the embodiment described above, a short straight tube is used as the gas supply nozzle 52 for supplying a gas from the gas supply section 50 into the annular gas diffusion space 48. Alternatively, a gas supply nozzle of the distribution type (gas distribution nozzle) may be used for the same purpose. FIG. 6 is a view showing a part of a structure that employs a gas supply nozzle of the distribution type (gas distribution nozzle). As shown in FIG. 6, a gas distribution nozzle 52X is bent to form an L-shape, and extends upward along the inner surface of the container body 4 (along the wafer boat 44 in a vertical direction). The gas distribution nozzle 52X has a number of gas spouting holes 52A formed at predetermined intervals in the vertical direction to be present over all the wafers W on the wafer boat 44. The gas spouting holes 52A are oriented to spout a gas in horizontal directions toward the wafers W. In this case, a gas is uniformly supplied to the wafers W, and so the inter-substrate uniformity of plasma processes can be improved.

Figure 7:
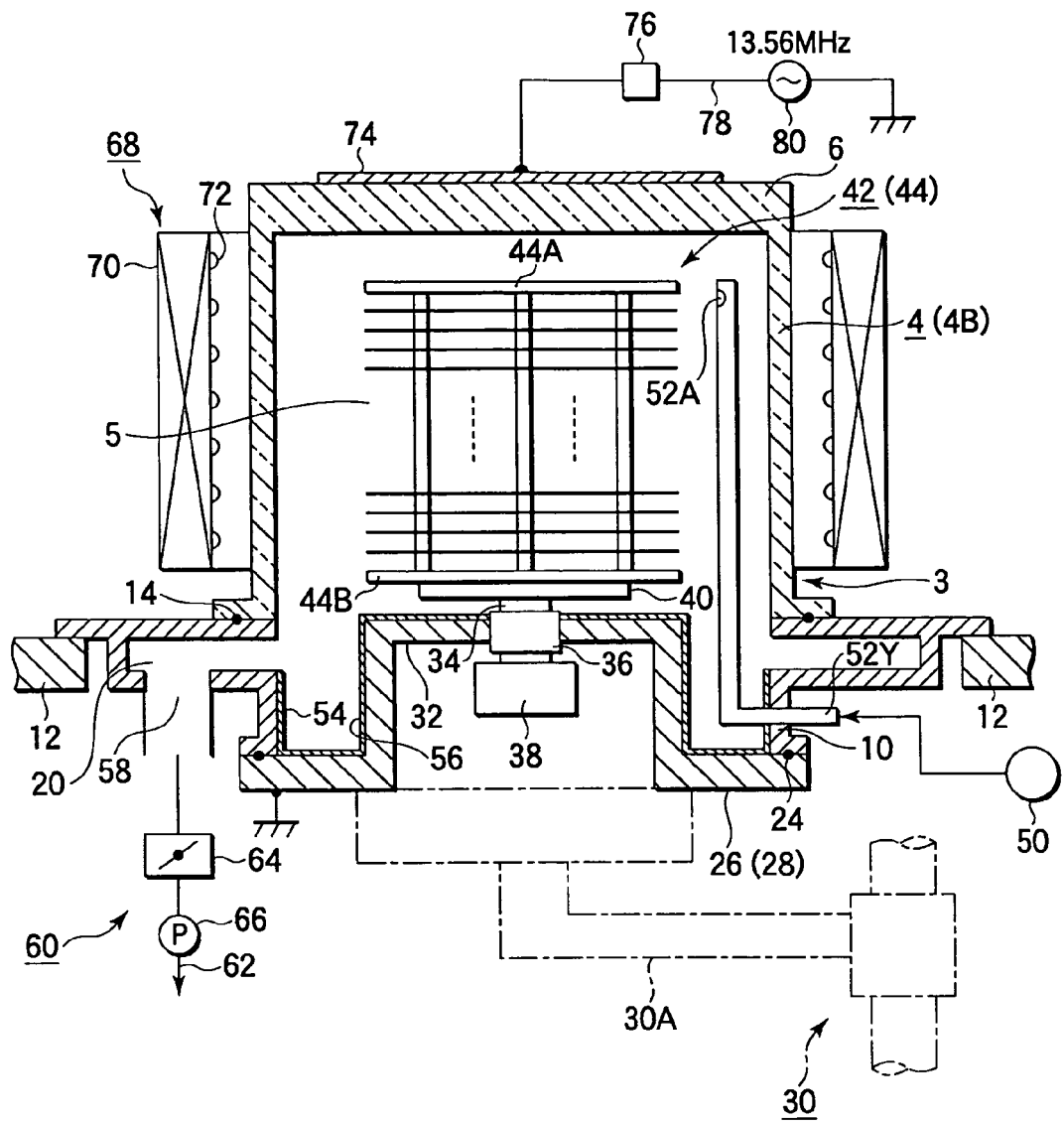
FIG. 7 is a sectional view showing a plasma processing apparatus of the batch type (vertical plasma processing apparatus), which employs a process container having a single-tube structure, according to another embodiment of the present invention.

In the embodiment described above, the container body 4 has a double-tube structure formed of the inner tube 4A and outer tube 4B. Alternatively, the container body 4 may have a single-tube structure. FIG. 7 is a sectional view showing a plasma processing apparatus of the batch type (vertical plasma processing apparatus), which employs a process container having a single-tube structure, according to another embodiment of the present invention.

As shown in FIG. 7, the container body 4 of the process container 3 has a single-tube structure formed only of the outer tube 4B without the inner tube 4A. Since no inner tube 4A is included, the support portion 16 (see FIG. 1) that supports the lower end of the inner tube 4A is omitted.

In this apparatus, a gas needs to be supplied at an upstream side of the gas flows inside the process container 3. Accordingly, a gas distribution nozzle 52Y connected to the gas supply section 50 is bent to form an L-shape, and extends upward to a position near the top of the container body 4. The gas supply nozzle 52Y has a gas spouting port 52A formed at the upper distal end to spout a gas toward a position near the ceiling portion of the container body 4. The gas supplied from the gas spouting port 52A flows downward within the process field 5, while coming into contact with the wafers W, and is then exhausted from the exhaust port 58 formed in the manifold 10.

In the single-tube structure described above, the manifold 10 may be made of quartz and integrated with the container body 4 on the upper side. In the embodiments described above, the ceiling portion 6 of the container body 4 is flat, but it may be curved alternatively.

Figure 8:
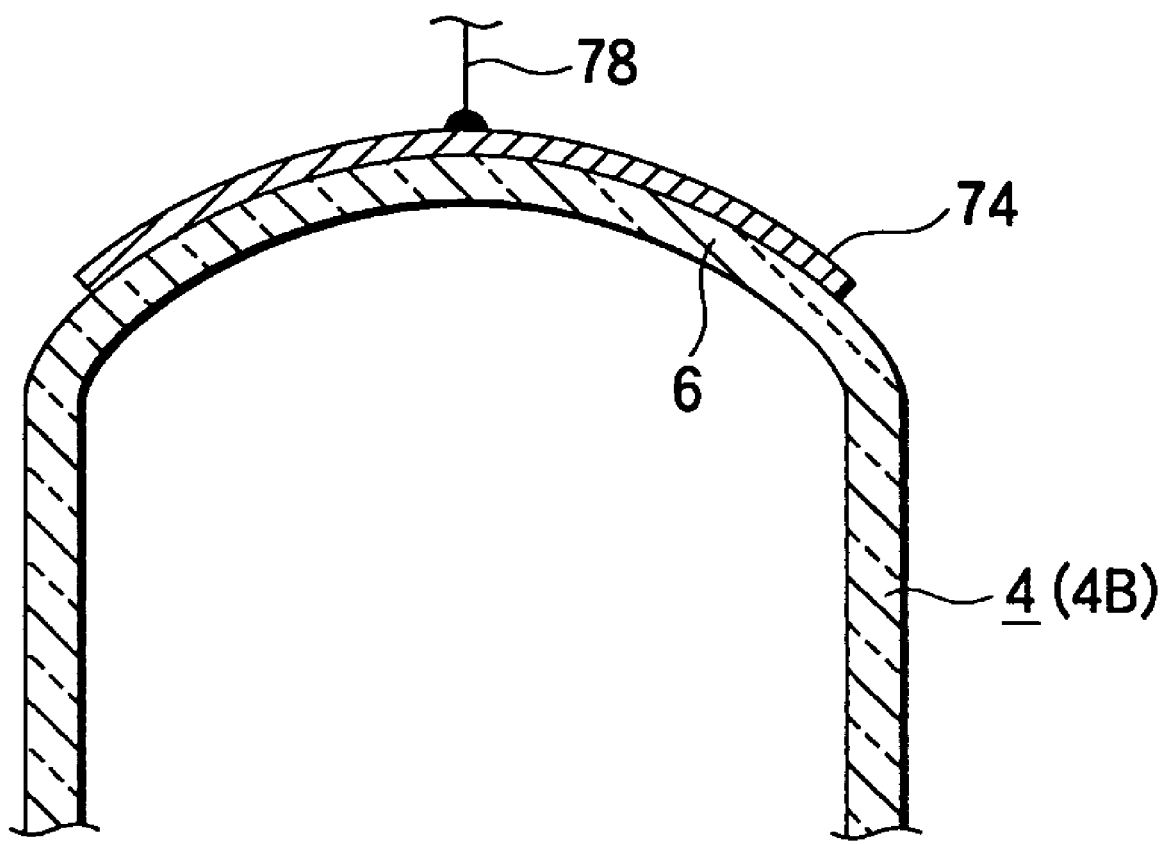
FIG. 8 is a view showing a part of a process container having a curved upper end.

FIG. 8 is a view showing a part of a process container having a curved upper end. As shown in FIG. 8, this container body 4 has a curved ceiling portion 6. This curved shape may be a domed shape or hemispherical shape. In this case, the upper electrode 74 is formed along the curved shape described above to have a curved shape with the same curvature. Where the ceiling portion 6 has a curved shape, the pressure resistance of the container body 4 is improved, and so the thickness of the ceiling portion 6 can be smaller than that of the flat ceiling portion described above.

In the embodiments described above, the wafer boat 44 is directly placed on the boat table 40. Alternatively, for example, a quartz heat-insulating cylinder may be used to support the wafer boat 44 and to be placed on the boat table 40.

In the embodiments described above, the process container 3 is stood in the vertical direction to constitute a vertical plasma processing apparatus. Alternatively, the present invention may be applied to a horizontal plasma processing apparatus with a process container 3 laid in the horizontal direction.

Further, as regards the target substrate, in place of a semiconductor wafer, the present invention may be applied to another substrate, such as a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vertical plasma processing apparatus of the batch type for performing a plasma process on a plurality of target substrates all together, the apparatus comprising:
   a tubular process container having an upper end as a closed end and a lower end as an open end opposite to each other, and a process field for accommodating the target substrates between the closed end and the open end, the process container including a tubular insulating body;
   a holder configured to hold the target substrates in parallel with each other and at intervals in a vertical direction, and to be loaded and unloaded through the open end into and from the process container;
   a loading mechanism configured to load and unload the holder into and from the process container through the open end;
   a lid member including a flange portion to engage with the open end and a mount portion projecting upward from the flange portion, the lid member being connected to the loading mechanism and configured to airtightly close the open end such that the mount portion projects into the tubular process container and supports the holder thereon;
   a gas supply system configured to supply a process gas into the process container;
   an exhaust system configured to exhaust gas from inside the process container;
   a first electrode disposed outside the closed end of the process container and having a planar surface area larger than that of each of the target substrates;
   a second electrode disposed at the lid member, the second electrode being an electrically conductive plate which shapes the lid member including the flange portion and the mount portion as a whole, the first and second electrodes constituting a pair of parallel-plate electrodes insulated from each other by the insulating body of the tubular process container; and
   a radio frequency (RF) power supply connected to one of the first and second electrodes and configured to apply an RF power for plasma generation.

2. The apparatus according to claim 1, wherein the other of the first and second electrodes is grounded.

3. The apparatus according to claim 1, wherein the insulating body has a length larger than the tubular process field, and the insulating body of the process container is surrounded by a heater for heating the target substrates.

4. The apparatus according to claim 1, wherein a surface of the electrically conductive plate, which faces an interior of the tubular process container, is covered with an insulating layer.

5. The apparatus according to claim 1, wherein the tubular process container comprises a tubular metal manifold connected to the insulating body and forming the open end.

6. The apparatus according to claim 5, wherein the manifold includes an annular exhaust space communicating with the process field and an exhaust port connecting the exhaust space to the exhaust system.

7. The apparatus according to claim 5, wherein the gas supply system includes a gas supply nozzle penetrating the manifold and configured to supply the process gas.

8. The apparatus according to claim 7, wherein the gas supply nozzle is opened at a certain position upstream from the process field and the manifold cooperates with the lid member to form an annular gas diffusion space configured for the process gas supplied from the gas supply nozzle to diffuse in an annular direction from the certain position.

9. The apparatus according to claim 1, wherein the apparatus further comprises a mechanism configured to rotate the holder and attached to the mount portion.

10. The apparatus according to claim 1, wherein the closed end of the tubular process container is flat.

11. The apparatus according to claim 1, wherein the closed end of the tubular process container is curved.

12. The apparatus according to claim 6, wherein the insulating body of the tubular process container has a double-tube structure comprising an inner tube and an outer tube with a gap space interposed therebetween, and the gap space is connected to the annular exhaust space at one end and communicates with the process field at the other end.

13. The apparatus according to claim 12, wherein the annular exhaust space projects outward in a radial direction relative to the insulating body of the tubular process container.

14. The apparatus according to claim 1, wherein the insulating body of the tubular process container has a single-tube structure.

15. The apparatus according to claim 14, wherein the process container comprises a tubular metal manifold connected to the insulating body and forming the open end, and the exhaust system is connected to the manifold, while the gas supply system is configured to supply the process gas from a position near the closed end of the process container.

16. The apparatus according to claim 1, wherein the gas supply system includes a gas distribution nozzle extending along an inner surface of the tubular process container and configured to supply the process gas, and the gas distribution nozzle has a plurality of gas spouting holes formed at predetermined intervals to be present over all the target substrates on the holder.

17. The apparatus according to claim 1, wherein the RF power supply is connected to the first electrode.

18. The apparatus according to claim 1, wherein the second electrode is 80 to 100 cm distant from the first electrode and the mount portion is 40 to 50 cm distant from the first electrode in a state where the lid member airtightly closes the open end.

19. The apparatus according to claim 1, wherein the tubular process container includes a tubular metal manifold connected to the insulating body and forming the open end, the manifold includes an inward extending portion at a position below the mount portion such that an annular gas diffusion space is defined between the flange portion and the inward extending portion in a vertical direction and between a rising side surface of the mount portion and an inner side surface of the manifold in a radial direction, and the gas supply system is configured to supply the process gas from a supply port opened in the gas diffusion space such that the process gas diffuses from the supply port in an annular direction inside the gas diffusion space.

20. A plasma processing apparatus for performing a plasma process on a plurality of target substrates, the apparatus comprising:

a process container having a closed end on one side and an opening on the other side in a vertical direction in which the process container stands, and comprising a dielectric cylinder;

a holder device configured to hold the target substrates and to be loaded through the opening into the process container;

a loading mechanism configured to load and unload the holder device into and from the process container;

a lid member connected to the loading mechanism and configured to airtightly close the opening;

a gas supply system configured to supply a gas into the process container;

an exhaust system configured to exhaust atmosphere inside the process container;

an electrode disposed outside an upper surface of a ceiling portion of the process container serving as the closed end;

an electrode disposed at the lid member, and a radio frequency (RF) power supply configured to apply RF power for plasma generation to one of the two electrodes, wherein the lid member includes a flange portion to engage with the opening and a mount portion projecting upward from the flange portion, the lid member being connected to the loading mechanism and configured to airtightly close the opening such that the mount portion projects into the process container and supports the holder device thereon, the electrode disposed outside an upper surface of a ceiling portion of the process container serving as the closed end is a first electrode having a planar surface area larger than that of each of the target substrates, and the electrode disposed at the lid member is a second electrode being an electrically conductive plate, which shapes the lid member including the flanges portion and the mount portion as a whole, the first and second electrodes constituting a pair of parallel-plate electrodes insulated from each other by the dielectric cylinder of the process container.

* * * * *